United States Patent [19]
Peterson

[11] Patent Number: 5,035,659
[45] Date of Patent: Jul. 30, 1991

[54] COMPLIANT TERMINAL PIN

[75] Inventor: Bruce A. Peterson, Schaumburg, Ill.

[73] Assignee: Molex Incorporated, Lisle, Ill.

[21] Appl. No.: 556,779

[22] Filed: Jul. 13, 1990

[51] Int. Cl.⁵ .......................................... H01R 13/428
[52] U.S. Cl. ..................................... 439/751; 439/82
[58] Field of Search ................. 439/82, 751, 825, 873

[56] References Cited

U.S. PATENT DOCUMENTS

| | | | |
|---|---|---|---|
| 3,783,433 | 1/1974 | Kurtz et al. | 439/82 |
| 4,681,392 | 7/1987 | Terita | 439/82 |
| 4,857,019 | 8/1989 | Brubaker et al. | 439/84 |

FOREIGN PATENT DOCUMENTS

| | | | |
|---|---|---|---|
| 59462 | 9/1982 | European Pat. Off. | 439/751 |
| 180055 | 5/1986 | European Pat. Off. | 439/82 |
| 3220781 | 12/1983 | Fed. Rep. of Germany | 439/751 |
| 2127625 | 4/1984 | United Kingdom | 439/751 |

Primary Examiner—Gary F. Paumen
Attorney, Agent, or Firm—Louis A. Hecht; Stephen Z. Weiss; A. A. Tirva

[57] ABSTRACT

A generally elongated electrical terminal pin is adapted to be inserted into a plated-through hole in a circuit board. The pin is a stamped and formed metal member and includes a mating portion adapted to contact an electrically conductive element and a compliant portion adapted to make electrical contact with conductive plating material defining an interior surface of the plated-through hole. The compliant portion, in a lateral direction, is formed by a generally W-shaped curved cross-section sized such that the outer legs of the W-shape contact the interior surface of the plated-through hole. In the exemplary embodiment, the compliant portion has a substantially uniform thickness, and the outer legs of the W-shape are substantially shorter than the central portion of the W-shape.

8 Claims, 1 Drawing Sheet

COMPLIANT TERMINAL PIN

FIELD OF THE INVENTION

This invention generally relates to electrical terminal pins and, particularly, to a terminal pin having a compliant portion adapted to be inserted into a plated-through hole in a circuit board or the like.

BACKGROUND OF THE INVENTION

Terminal pins with compliant sections or portions (sometimes called press-fit pins) have been known in the art for many years. Compliant pins are designed to be inserted into a plated-through hole in a printed circuit board or other conductive plate. The pin generally includes a mating portion adapted to contact an electrically conductive element and a compliant portion extending from the mating portion and adapted to make electrical contact with conductive material defining the interior surface of the plated-through hole. Therefore, a solder-free electrical connection is made between the pin and the hole, i.e., the conductive interior surface of the hole.

Such pins provide high reliability applications without the necessity of solder. The pins should be able to withstand repeated insertions and withdrawals from the plated-through hole without damaging the interior surface of the hole. Elastic strain energy mostly should be stored in the compliant portion of the pin. The pins should be able to be used over a wide range of hole sizes to eliminate the need for different thicknesses of the plating material formed in the hole. Relatively lower insertion forces should be provided so that mass insertion is feasible. These and other characteristics of compliant pins are provided by the terminal pin of the invention as well as in compliant terminal pins of the prior art. For instance, a terminal pin with an S-shaped compliant portion is shown in U.S. Pat. No. 4,857,019 to Brubaker et al., dated Aug. 15, 1989 and assigned to the assignee of this invention.

One of the problems of most prior art compliant terminal pins is that their configurations are formed through a series of coining operations which result in work hardening of the metal forming the compliant portion of the pin. Due to this work hardening, high residual stresses, along with increased surface hardening, results in a much less ductile and inelastic compliant portion than may be desired. Coined compliant pins also are very "diameter dependent", i.e., they cannot conform to as wide a range of whole diameters and center-to-center variability between holes as might be desired. In addition, the less the flexibility of the compliant portion, the greater the possibility of piercing or cutting through the plating on the interior surface of the plated-through hole.

This invention is directed to solving the above problems and satisfying the need for a new and improved compliant terminal pin of improved elasticity of its compliant portion.

SUMMARY OF THE INVENTION

An object, therefore, of the invention is to provide a new and improved electrical terminal pin having a compliant portion adapted to be inserted into a plated-through hole in a circuit board or the like.

In the exemplary embodiment of the invention, the pin includes a mating portion adapted to contact an electrically conductive element, with the compliant portion adapted to make electrical contact with conductive plating material defining an interior surface of the plated-through hole. The compliant portion is formed, in a lateral direction, by a generally W-shaped curved cross-section which is sized such that the outer legs of the W-shape contact the interior surface of the plated-through hole.

As disclosed herein, the compliant portion of the terminal pin is formed by a stamped and formed metal area of the pin. Preferably, the terminal pin, including the compliant portion, comprises a stamped and formed metal member wherein the compliant portion has a substantially uniform thickness. The outer legs of the W-shape are substantially shorter than the central portion of the W-shape such that both the outer legs of the W-shape as well as the central portion contact the interior surface of the plated-through hole. Such a configuration provides a large area for engagement with the interior of the plated-through hole with a large normal force. The W-shape is a curved shape to resist damage to the plating in the hole, and the shape provides extraordinary elasticity for the compliant portion to accommodate a wide range of hole diameters and center-to-center hole variability.

The configuration of the compliant portion of the terminal pin might, alternatively, be described as a region, in a lateral direction, having a cross-section with an inverted U-shaped central portion with non-inverted U-shaped portions at the end of each leg of the inverted U-shaped central portions.

Other objects, features and advantages of the invention will be apparent from the following detailed description taken in connection with the accompany drawings.

BRIEF DESCRIPTION OF THE DRAWINGS

The features of this invention which are believed to be novel are set forth with particularity in the appended claims The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
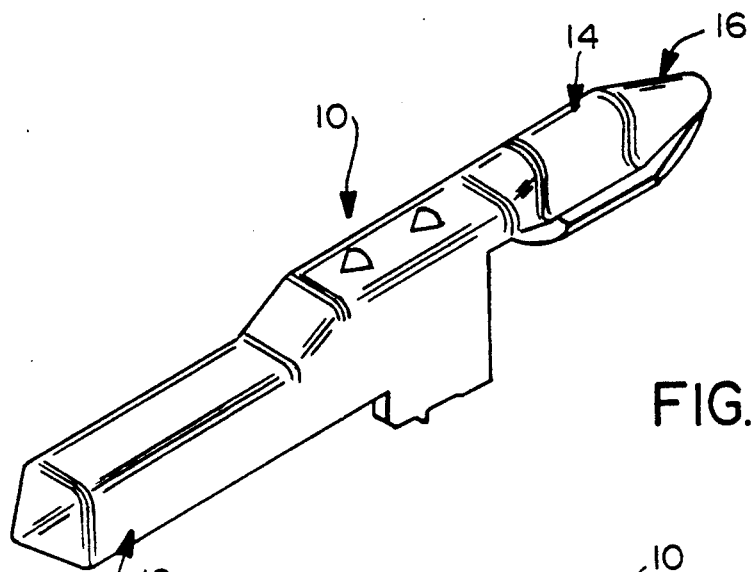
FIG. 1 is a perspective view of a compliant terminal pin incorporating the concepts of the invention.
Figure 2:
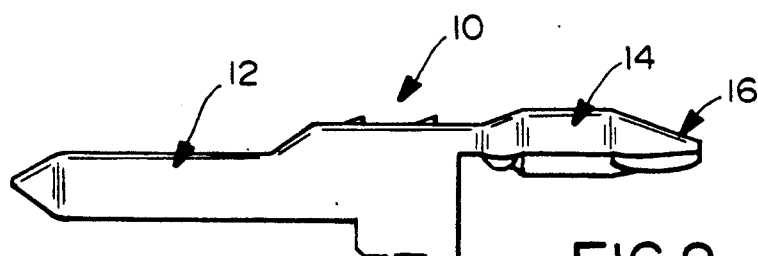
FIG. 2 is a side elevational view of the terminal pin.
Figure 3:
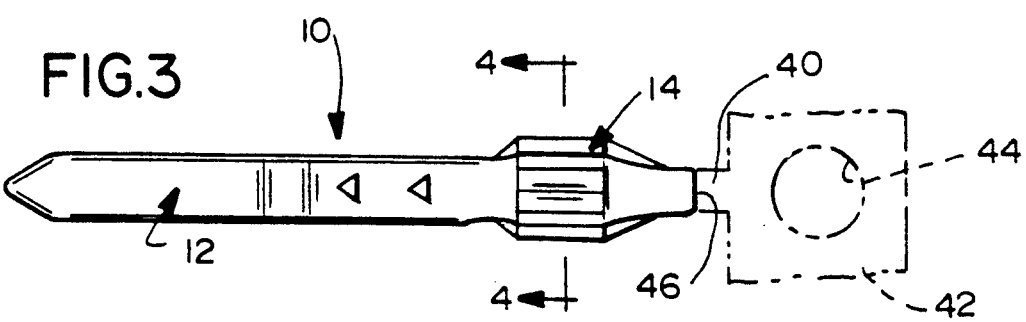
FIG. 3 is a top plan view of the terminal pin.

Referring to the drawings in greater detail, and first to FIGS. 1-3, the invention is embodied in a generally elongated electrical terminal pin, generally designated 10, which is adapted to be inserted into a plated-through hole formed in a printed circuit board.

Pin 10 includes a mating portion, generally designated 12, which is adapted to contact an electrically conductive element (not shown) and a compliant portion, generally designated 14, which extends from mating portion 12. The compliant portion is adapted to make electrical contact with the conductive plating which defines the interior surface of the plated-through hole.

Mating portion 12 can be in a number of configurations. As is shown in the drawings, the mating portion is generally U-shaped in cross-section to form a male pin which is adapted to mate with a conventional female contact (not shown).

Terminal pin 10, as shown, also includes a second or lower mating portion, generally designated 16, in the form of a post which would depend from compliant portion 14 when inserted downwardly through a hole in a circuit board. As will be described in greater detail hereinafter, post 16 is wedge-shaped to provide a lead-in tip of the pin to facilitate insertion of the pin into the circuit board hole. A female connector, wire wrap or the like can be applied to depending post 16.

Figure 4:
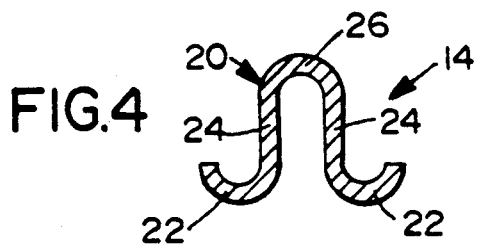
FIG. 4 is a vertical section taken generally along line 4—4 of FIG. 3.
Figure 5:
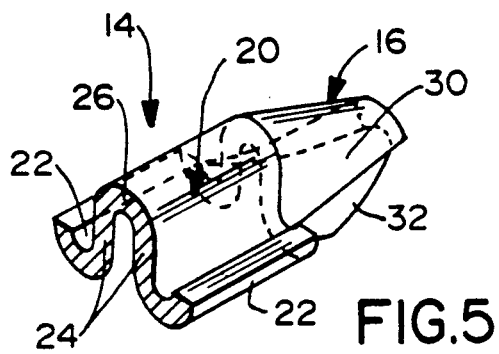
FIG. 5 is a sectioned perspective view of the compliant portion and the adjacent end of the pin.

Referring to FIGS. 4 and 5 in conjunction with FIGS. 1–3, compliant portion 14 of terminal pin 10 is formed, in a lateral direction, with a generally W-shaped curved cross-section. The W-shape includes a central portion, generally designated 20, and outer legs 22 forming a continuous curvature from legs 24 of central portion 20. Preferably, the curvature of legs 22 are on a radius equal to the radius of a top or crown 26 of central portion 20. It can be seen that outer legs 22 are substantially shorter than central portion 20.

An alternate way to describe the configuration of compliant portion 14 might be to define central portion 20 as having an inverted U-shape, with a non-inverted U-shaped portion or leg 22 at the end of each leg 24 of the inverted U-shaped central portion. Of course, it should be understood in this context, and in the claims hereof, that the "inverted" or "non-inverted" are intended to mean the direction of the compliant portion as shown in the depiction of the drawings.

As seen best in FIG. 5, post 16 is formed as a continuation of the adjacent W-shaped compliant portion 14. In particular, the post is in a tapered configuration, having a generally conically shaped crown 30 as a continuation of central portion 20 of the W-shaped compliant portion, with side wing portions 32 forming tapering continuations of legs 22 of the W-shaped compliant portion Therefore, a smooth transition is made from compliant portion 14 to post 16, resulting in a wedge configuration to facilitate insertion and leading the terminal pin into a hole in a circuit board.

Figure 6:
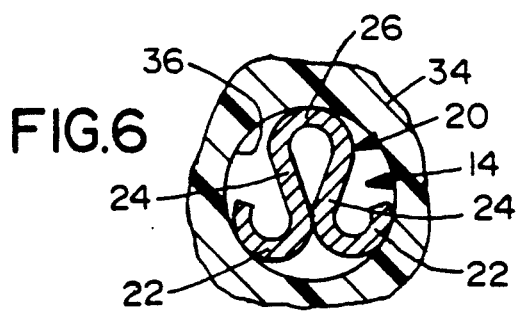
FIG. 6 is a view similar to that of FIG. 4, but with the terminal pin inserted into a hole in a circuit board.

Referring to FIG. 6, a fragmented section of a circuit board 34 is shown with a through hole 36. The through hole has an interior surface which is plated with conductive material, as is known in the art, to establish electrical contact with compliant portion 14 of terminal pin 10. This depiction shows how the compliant portion flexes to conform to the hole diameter as post 16 is inserted through the hole until the compliant portion is in registry with the hole and in contact with the conductive interior surface thereof. It can be seen how legs 24 of central portion 20 of the W-shape can easily flex inwardly toward each other. With the diameter of hole 36 shown in FIG. 6, legs 24 can bend all the way until they actually touch. With larger diameter holes, the legs might not touch. However, the legs provide considerable elasticity for the compliant portion. Outer legs 22 themselves are curved and provide for still more elasticity for the compliant portion. It can be seen that both legs 22 and top 26 of central portion 20 are in contact with the interior surface of the hole to provide a large contact area. In addition, as the configuration is deformed when inserted into the hole, it can be seen that legs 22 curl inwardly and the outer smooth surfaces of the legs are the areas of the legs which actually contact the interior of the hole, whereby there are no sharp edges whatsoever to cause damage to the interior plating, because of the curved configuration of the W-shape.

Lastly, terminal pin 10 is manufactured as a stamped and formed metal member, fabricated from a continuous metal blank strip. To that end, FIG. 3 shows, in phantom, terminal pin 10 connected by a web 40 to a carrier strip 42 having machine indexing holes 44. Web 40 is cut, as at 46, after a stamping and forming operation, to leave the fabricated terminal pin as described above.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A terminal pin for press-fit engagement in a conductive hole in a circuit board, the pin including a compliant region adapted to be pressed into the conductive hole thereby to make a solder-free electrical connection between the pin and the board, said compliant portion comprising, in a lateral direction, a cross-section with an inverted U-shaped central portion with a non-inverted U-shaped portion at the end of each leg of the inverted U-shaped central portion, said non-inverted U-shaped portions being substantially shorter than said inverted U-shaped central portion such that the central portion also contacts the conductive hole, said inverted U-shaped portion being defined by two substantially straight and parallel walls.

2. The terminal pin of claim 1 wherein said compliant portion comprises a stamped and formed metal area of the pin.

3. The terminal pin of claim 2 wherein said terminal pin including said compliant portion comprises a stamped and formed metal member.

4. The terminal pin of claim 1 wherein said compliant portion has a substantially uniform thickness.

5. The terminal pin of claim 1 including a post portion extending away from said compliant portion, one post portion being a continuation of the cross-section of the compliant portion and being tapered laterally inwardly therefrom to provide a hole lead-in end for the terminal pin.

6. The terminal pin of claim 5 wherein said post portion includes a tapered central wedge portion forming a continuation of said inverted U-shaped central portion and outside wings forming continuations of said non-inverted U-shape portions.

7. The terminal pin of claim 6, wherein said post and compliant portions are made of metal of substantially uniform thickness.

8. The terminal pi of claim 1, wherein the parallel walls of the U-shaped portions are joined by curved portions formed with substantially the same radius.

* * * * *